United States Patent [19]

Kobayashi et al.

[11] Patent Number: 5,045,904
[45] Date of Patent: Sep. 3, 1991

[54] SEMICONDUCTOR DEVICE INCLUDING AN IMPROVED TRENCH ARRANGEMENT

[76] Inventors: Yutaka Kobayashi, 2773-6, Mawatari, Katsuta-shi, Ibaraki-ken; Akihiro Tanba, 6-20-3, Ayukawa-cho, Hitachi-shi, Ibaraki-ken; Ryoichi Hori, 2196-125, Hirai, Hinode-cho, Nishitama-gun, Tokyo; Kyoichiro Asayama, 1-3-17, Wakaba-cho, Tachikawa-shi, Tokyo; Seigoh Yukutake, 3-10-12, Suehiro-cho, Hitachi-shi, Ibaraki-ken; Hiroyuki Miyazawa, 1-436, Ogawa-cho, Kodaira-shi, Tokyo; Kazumasa Yanagisawa, 1-41-5, Hikari-cho, Kokubunji-shi, Tokyo; Goro Kitsukawa, 2196-468, Hirai, Hinode-cho, Nishitama-gun, Tokyo, all of Japan

[21] Appl. No.: 286,870

[22] Filed: Dec. 20, 1988

[30] Foreign Application Priority Data

Dec. 21, 1987 [JP] Japan .................................. 62-321376

[51] Int. Cl.$^5$ ............................................ H01L 29/68
[52] U.S. Cl. ..................................... 357/23.6; 357/43; 357/47; 357/50; 357/54
[58] Field of Search .................... 357/47, 50, 23.6, 43, 357/23.6 G, 49, 51, 54

[56] References Cited

U.S. PATENT DOCUMENTS

| 4,689,656 | 8/1987 | Silvestri et al. | 357/50 |
| 4,799,099 | 1/1989 | Verret et al. | 357/50 |
| 4,873,560 | 10/1989 | Sunami et al. | 357/23.6 |
| 4,918,502 | 4/1990 | Kaga et al. | 357/23.6 G |

FOREIGN PATENT DOCUMENTS

| 58-200553 | 11/1983 | Japan | 357/50 |
| 62-155557 | 7/1987 | Japan | 357/23.6 |
| 63-226058 | 9/1988 | Japan | 357/23.6 |
| 63-266878 | 11/1988 | Japan | 357/47 |

Primary Examiner—Andrew J. James
Assistant Examiner—Courtney A. Bowers
Attorney, Agent, or Firm—Antonelli, Terry, Stout & Kraus

[57] ABSTRACT

A small and reliable semiconductor device is provided in a substrate which has an isolation trench and a capacitor trench. The isolation trench isolates a bipolar transistor from other semiconductor devices, and the capacitor trench provides capacitance to a memory cell which is formed in the substrate. The interior of the device isolation trench is kept in a floating state with respect to the surrounding semiconductor regions by forming an insulating film over the inner surface of the trench. In the capacitor trench, insulating layers and resilient conductive layers are formed alternately to form capacitance between the opposing conductive layers.

7 Claims, 5 Drawing Sheets

SEMICONDUCTOR DEVICE INCLUDING AN IMPROVED TRENCH ARRANGEMENT

BACKGROUND OF THE INVENTION

This invention relates to an ultrahigh-speed semiconductor memory device with high-density circuit integration and more specifically to a Bipolar CMOS dynamic RAM (BiCMOS DRAM).

The conventional method of isolating devices from one another in BiCMOS DRAM is discussed in the IEDM Technical Digest 1986, in pages 802 to 804.

The above conventional technique employs a reverse-biased p-n junction for device isolation, especially for isolating bipolar transistors from one another.

In a typical construction of a semiconductor device formed by such a technique, an n-type epitaxial layer is grown on a p-type substrate, and a p-type impurity for device isolation is diffused into the n-type epitaxial layer to a depth reaching the p-type substrate, thus forming a large number of isolated n-type islands on the p-type silicon substrate.

This method of device isolation by use of a p-n junction increases the parasitic capacitance of the bipolar transistor and particularly the capacitance between the collector and the substrate, and this has been an obstacle to improving the operation speed.

As a method of reducing the parasitic capacitance, a so-called U-isolation or trench isolation is used, in which a trench formed for device isolation is filled with silicon dioxide $SiO_2$ or polycrystalline silicon. This trench is also used for forming capacitance. An example of forming capacitance by using a trench is given in the Japanese Patent Application Laid-Open No. 226657/1987.

These trench constructions, however, have problems such as a high possibility of deformation when stress concentrates at the trench, a reduction in yield and reliability, and a cost increase.

SUMMARY OF THE INVENTION

The object of this invention is to provide a semiconductor device and a method of manufacturing the semiconductor device, which has trenches for separating devices and trenches for forming capacitance of memory cells and which is small and reliable and can be fabricated easily without increasing the number of manufacturing processes.

A semiconductor device according to this invention has a semiconductor substrate that include trenches for isolating bipolar transistors from other semiconductor devices and trenches for forming capacitance of memory cells. An insulating film is formed over the entire inner surfaces of the device isolation trenches to keep the trenches floated from the surrounding semiconductor regions, and in the memory cell capacitance formation trenches, insulating layers and resilient conductive layers are arranged alternately to form capacitance between the opposing conductive layers.

Another feature of this invention is that one of the opposing conductive layers in the capacitance formation trenches is connected to a semiconductor region in contact with the bottom of the trench to keep the conductive layer at a fixed potential and that the semiconductor region is in turn connected to an adjacent semiconductor region similarly formed at the bottom of the capacitance formation trench, thereby making it possible for the above two kinds of trenches to be formed in almost the same processes.

With the above construction, it is possible to simultaneously form two kinds of trenches—device isolation trenches so formed that parasitic capacitance will not easily develop in the bipolar transistors, and capacitance formation trenches for a memory cell made up of MOSFET—without increasing the number of manufacturing processes.

A semiconductor region of high impurity concentration formed at the bottom of the MOSFET capacitance formation trench may be connected to an adjacent semiconductor region of high impurity concentration similarly formed at the bottom of the trench, so that the potentials of the conductor portions (plate potentials) of all memory cells can be held at the same potential without having to individually connect the conductor portions in the trench to an external fixed potential. This in turn reduces the size of the semiconductor device as a whole.

Since in the device isolation trench, the insulators and resilient conductors are alternately formed, the stress and deformation of the substrate is absorbed, improving reliability.

BRIEF DESCRIPTION OF THE DRAWINGS

The above and other objects, features and advantages of the present invention will be described hereinafter with respect to the accompanying claims and drawings, in which like reference numerals are used to describe similar parts throughout the several views of the invention, and wherein:

DETAILED DESCRIPTION OF THE PREFERRED EMBODIMENT

The present invention will now be described in detail with reference to the accompanying drawings.

Figure 1:
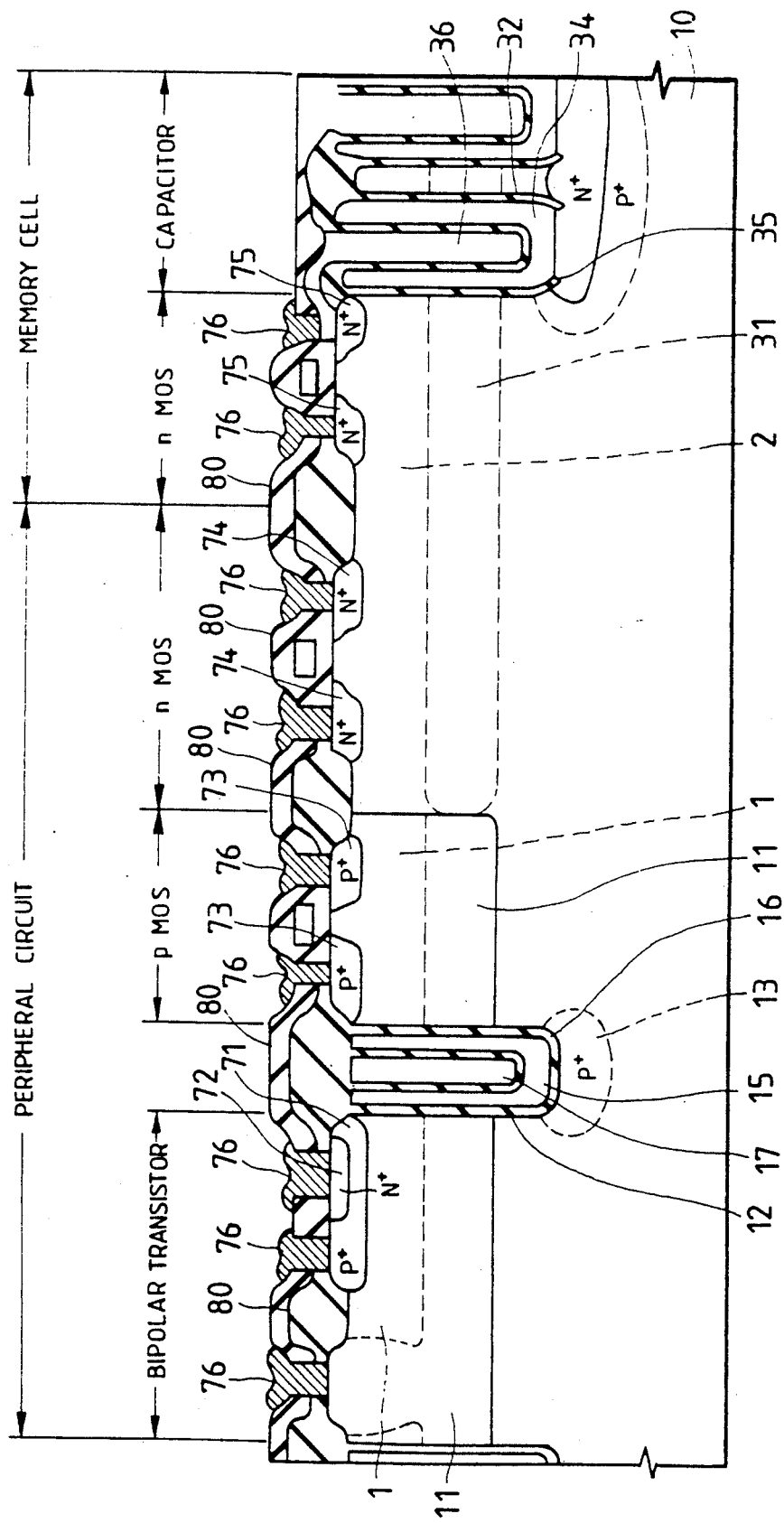
FIG. 1 is a cross section showing the construction of the semiconductor device as one embodiment of this invention, as applied to a BiCMOS DRAM.

FIG. 1 is a cross section showing the construction of one embodiment in which the semiconductor device of this invention is applied to a BICMOS DRAM.

In FIG. 1, on the surface of a p-type substrate 10 an n+ buried layer 11 and a p+ buried layer 31 are formed by conventional technique such as ion implantation and diffusion. On these layers are formed a high-resistance n-well 1 (n-type epitaxial layer) and a p-well 2 (p-type epitaxial layer) by a technique of epitaxial growth.

Designated 12 is a trench for isolating the bipolar transistor from other devices and is formed so as not to generate parasitic capacitance with a view to increasing the operation speed. Denoted 32 is a trench for forming a memory cell capacitance large enough to retain electric charge as information.

The trench 12 for isolating devices and the trench 32 for forming a memory cell capacitance are formed by selective etching after the n-well 1 and the p-well 2 are formed. And then insulating films 16 and 35 such as silicon dioxide SiO₂, and conductive layers 15, 17, 34 and 36 such as n+ polycrystalline silicon are alternately stacked to form a multilayer structure.

Next, an insulating layer 80 is formed over the entire surface, and specified portions of the insulating layer 80 are removed to form semiconductor regions 71, 72, 73, 74 and 75 by ion implantation or diffusion.

This is followed by formation of electrodes 76 for each device, which is accomplished by first vapor-depositing a thin film of metal such as aluminum and then etching away specified portions.

Generally, as memory cells are formed close together, the potential of the well 2 of the transfer MOS (in FIG. 1, nMOS adjacent to the capacitor) is floating because of the depletion layer formed between capacitors. The presence of the p+ buried layer 31 suppresses the extension of the depletion layer, fixing the potential of the well 2.

Figure 2:
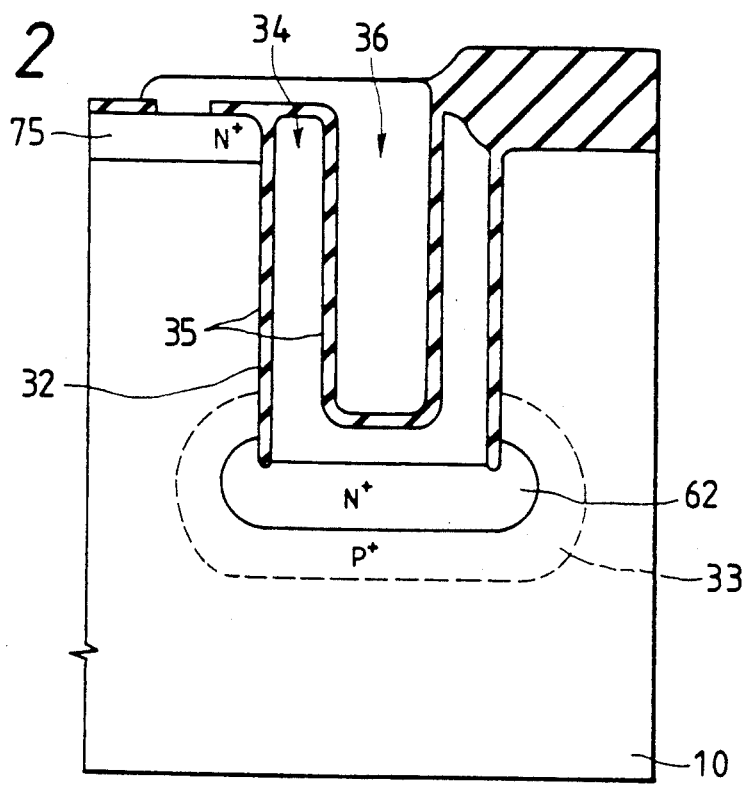
FIG. 2 is an enlarged cross section showing the construction of a trench for memory cell capacitance 32.

Next, the constructions of the device isolation trench 12 and the memory cell capacitance formation trench 32 are described in more detail by referring to FIG. 2.

FIG. 2 is an enlarged cross section showing the structure of the memory cell capacitance formation trench 32. Like reference numbers represent identical parts shown in FIG. 1. In the figure, reference numerals 33 and 62 represent the p+ region and the n+ region, respectively, formed at the bottom of the memory cell capacitance formation trench 32. The p+ region is formed by ion implantation and the n+ region by diffusion.

The n+ polycrystalline silicon 34 is isolated from the p-type substrate 10 by a p-n junction to allow its potential (plate potential) to be arbitrarily selected. If the plate potential is set, for instance, to half the supply voltage, the insulation film for capacitor may be reduced by one half, which doubles the capacitance of the trench.

The plate potential is equal for all memory cells, so that if the trench bottom is covered with silicon dioxide, an area is needed to connect the polycrystalline silicon layer 34 to an external fixed potential, increasing the cell area.

For this reason, the silicon dioxide film at the bottom of the trench is removed, and the silicon layer immediately below it is formed as n+ type The N+ layer 62 is connected to the n+ layer of the adjacent memory cell. This construction obviates the need for providing a dedicated area for connecting the N+ layer to an external circuit, reducing the memory cell area to the minimum.

Figure 9:
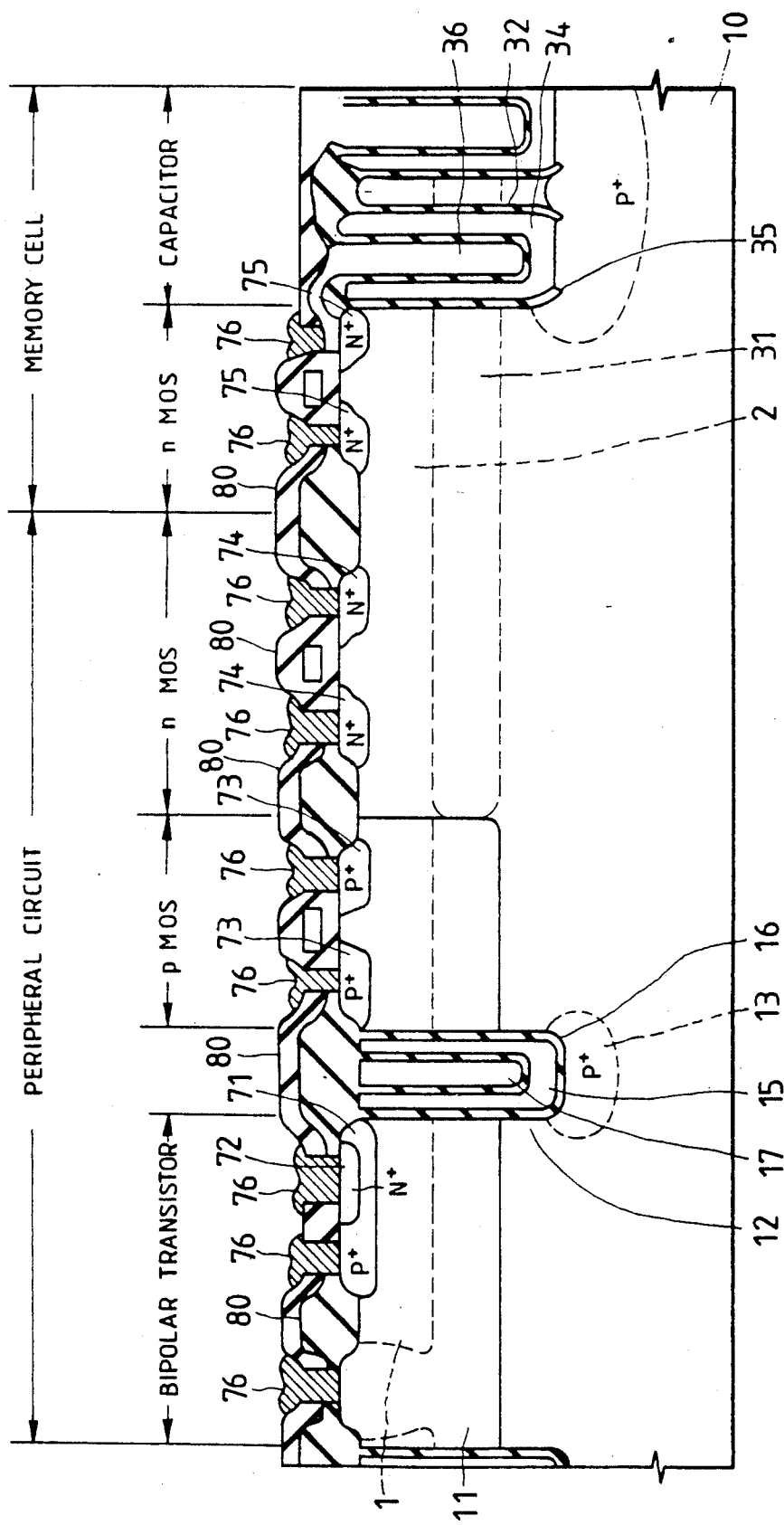
FIG. 9 is a cross section showing the construction of another embodiment of this invention.

When the plate potential can be set equal to the potential of the p-type substrate 10, the p+ layer 33 may be provided immediately below the bottom of the trench 32 without the need for the n+ layer 62 (see FIG. 9). In either case, the n+ polycrystalline silicon 34 must be connected to a fixed potential, which may, preferably, be accomplished by removing the silicon dioxide film at the bottom of the trench.

Figure 3:
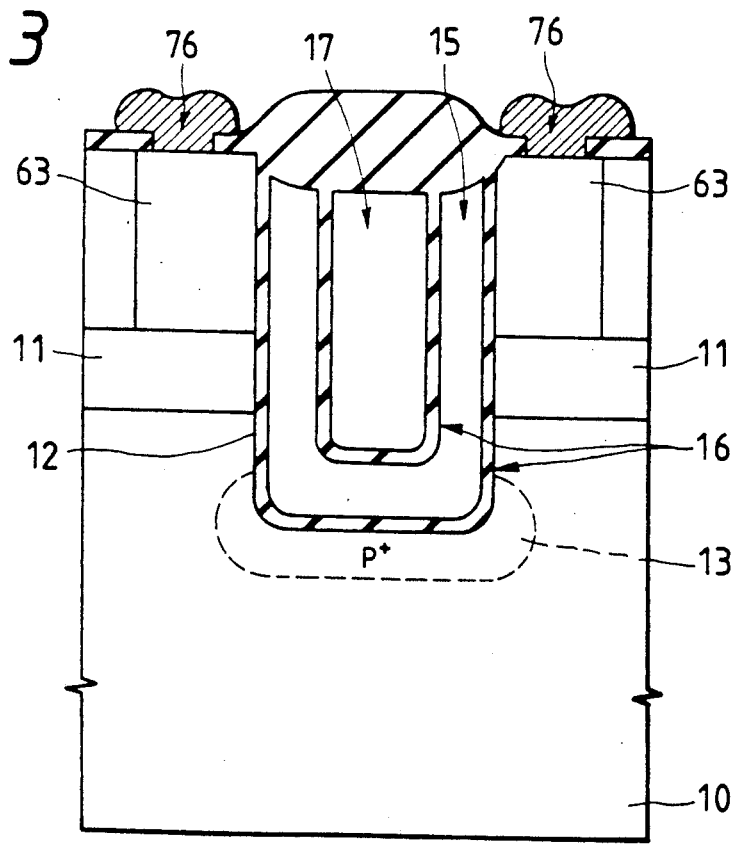
FIG. 3 is an enlarged cross section showing the construction of a device isolation trench 12.

FIG. 3 is an explanatory drawing showing the structure of the device isolation trench 12 for the bipolar transistor. Like reference numerals represent identical parts of FIG. 2.

Denoted 13 is a p+ region formed at the bottom of the device isolation trench 12 by ion implantation. Designated 63 is an n+ collector region of the bipolar transistor formed below the electrode 76 by ion implantation or diffusion.

In the figure, unlike the memory cell capacitance formation trench 32, the silicon dioxide film 16 at the bottom of the device isolation trench 12 is not removed, to maintain the n+ polycrystalline silicon 15 in a floating state by the insulating film 16 and to prevent formation of parasitic capacitance between the trench 12 and a collector region 63 of the bipolar transistor.

The internal structure of the device isolation trench 12 has a two-layer construction, in which the resilient polycrystalline silicon regions 15 and 17 are separated from each other by the inner silicon dioxide film 16. This construction contributes to preventing deformation of the trench and suppressing the occurrence of crystal defects in the silicon layer.

Now, the method of forming the device isolation trench 12 and the memory cell capacitance formation trench 32, both the features of this invention, will be explained by referring to the accompanying drawings.

Figure 4:
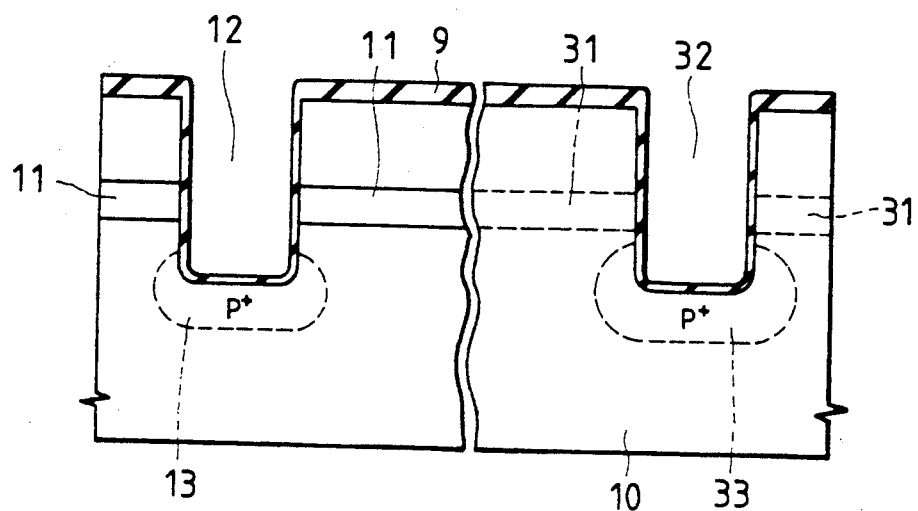
FIGS. 4 through 8 are cross sections showing the construction of the semiconductor device of the invention at various stages during manufacture.

FIG. 4 is a partially enlarged view of the device isolation trench 12 and of the memory cell capacity formation trench 32. In the figure, reference numeral 9 represents an insulating film and like reference numerals signify identical parts of FIG. 1.

In the BiCMOS DRAM to which the abovementioned construction of this invention is applied, the n+ buried layer 11 and the p+ buried layer 31 are first formed on the surface of the p-type substrate 10 by the conventional technique such as ion implantation or diffusion.

Then, on these buried layers the high-resistance n-well and p-well are formed by the normal epitaxial growth technique.

After this, the trench 12 and trench 32 are formed by selective etching at locations where the device isolation trench and the memory cell capacitance formation trench are to be formed. Then, the mask (not shown) used for the trench formation is used as is, to form the p+ regions 13 and 33 at the bottom of the trenches by ion implantation.

The mask is then removed, and the insulating film 9 is formed over the entire surface. In this case, the silicon dioxide film 9 is formed by a thermal oxidation method.

Figure 5:
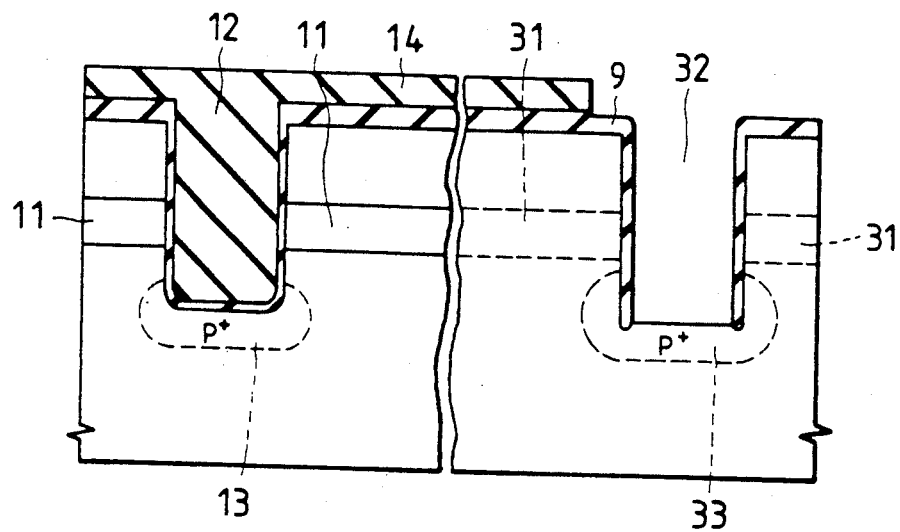

Next, as shown in FIG. 5, the trench of device separation region 12 (left half in the drawing) is covered with a resist mask 14, and the oxide film 9 at the bottom of the trench of memory cell capacitance region 32 (right half of the drawing) is removed by anisotropic dry etching This etching does not remove the silicon dioxide film 9 on the side surface of the trench 32.

Figure 6:
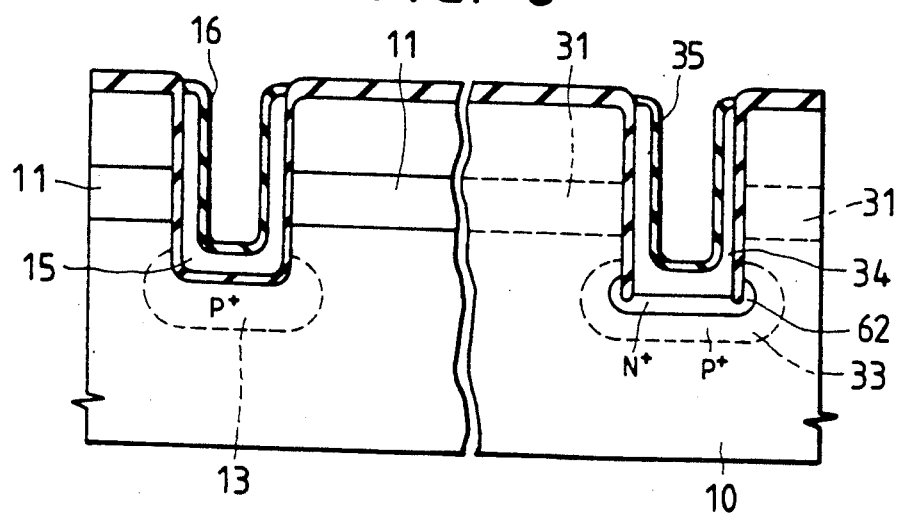

Then, as shown in FIG. 6, the n+ polycrystalline silicon is formed over the entire surface, after which all the n+ polycrystalline silicon except for those in the trenches 15 and 34 is removed.

Further, the insulating films 16 and 35 are formed on the n+ polycrystalline silicon 15 and 34. The insulating films may be SiO₂ or Si₃N₄, or composite film of SiO₂ and Si₃N₄. Here the composite film was used.

Figure 7:
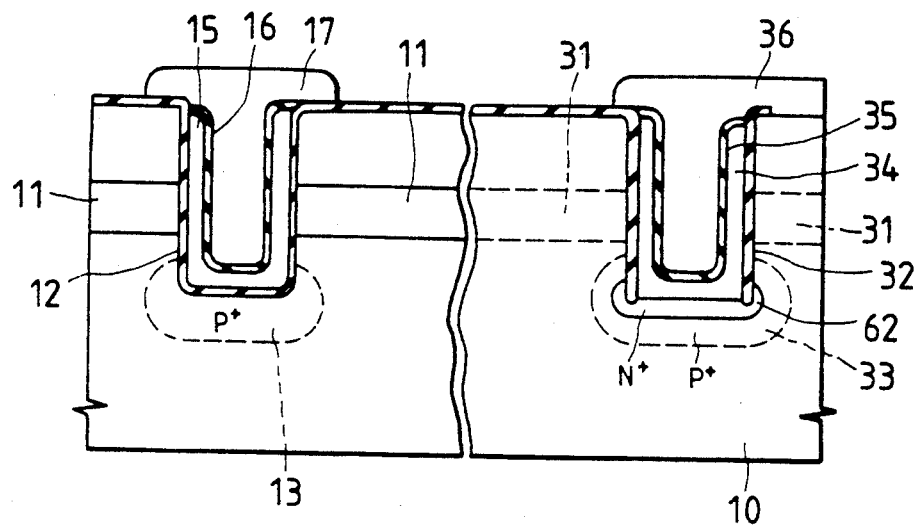

Next, as shown in FIG. 7, after the n+ polycrystalline silicon is formed over the entire surface, it is etched away except for the trench regions 12 and 32 and the regions connecting to the NMOS source or drain, and except for the regions used as circuits. In FIG. 7, only the n+ polycrystalline silicon 17 and 36 left in the trench regions is shown.

Figure 8:
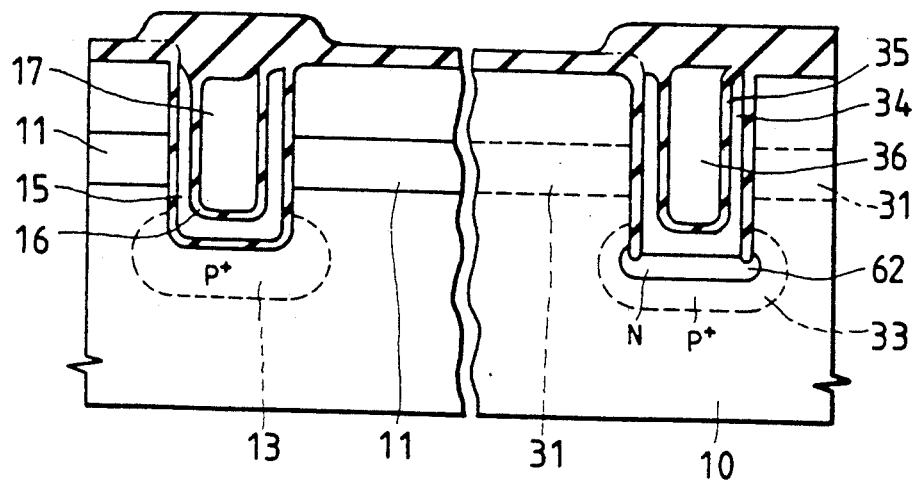

Then, in FIG. 8 the device isolation region or a part of the trench capacitance region, and the CMOS isolation regions are transformed into silicon dioxide by a wet thermal oxidation method. At the bottom of the trench capacitance region the n+ region 62 is formed because the thermal processing after the formation of a polycrystalline silicon film causes the n-type impurity in the polycrystalline silicon to be diffused into the single-crystal silicon layer.

In the above embodiment, the n+ region is formed at the bottom of the memory cell capacitance formation trench 32 and an arbitrary potential is applied to the polycrystalline silicon below it. As shown in FIG. 9, the lower polycrystalline silicon region may be formed as a p+ region, and the n+ region may be omitted.

In such a case, the lower polycrystalline silicon 34 has the same potential as the p-type substrate 10. Also, in FIG. 9 like reference numerals represent identical parts of FIG. 1.

Although we have described this invention as applied to a BiCMOS DRAM, it is apparent that the invention can also be applied to any LSIs (for example, static RAM) that utilize the BiCMOS structure.

This invention has the following advantages. That is, since the parasitic capacitance of a bipolar transistor is reduced, the operating speed of the transistor is increased. The reduced isolation area allows higher density for circuit integration. Since the device isolation trench and the memory cell capacitance formation trench in the bipolar transistor are formed simultaneously (by the common processes), the manufacturing process can be simplified, which in turn results in reduced cost and higher reliability. Furthermore, since the interior of these trenches are formed in a multiple-layer structure consisting of insulating films and resilient conductors, deformation of the trenches can be alleviated, further improving reliability.

Although the present invention has been described with respect to the specific embodiment herein, it is not limited thereto, and is adapted to cover all obvious variations and embodiments thereof.

What is claimed is:

1. A semiconductor device with trenches comprising:
a substrate of a first conductivity type on which at least a bipolar transistor and a memory cell having a MOSFET and a capacitor are formed,
wherein the substrate includes an isolation trench for isolating the bipolar transistor from other semiconductor elements, and a capacitor trench for providing the capacitor for the memory cell,
wherein said isolation trench has a multiple-layer structure in which insulating layers and resilient conductive layers are alternately formed,
wherein an interior of the isolation trench is kept in a floating state with respect to a semiconductor region surrounding the isolation trench by an insulating film formed over an inside surface of the isolation trench, and
wherein the capacitor trench includes at least one pair of conductive layers which are isolated from each other, one conductive layer being coupled to the MOSFET at a surface of the substrate, and the other conductive layer being electrically coupled to a fixed potential at a bottom of the capacitor trench.

2. A semiconductor device with trenches comprising:
a substrate having a major surface on which at least a bipolar transistor and a memory cell having a MOSFET and a capacitor are formed,
wherein the substrate includes an isolation trench for isolating the bipolar transistor from other semiconductor elements, and a capacitor trench for providing the capacitor for the memory cell, wherein the capacitor trench has side surfaces and a bottom,
wherein said isolation trench has a multiple-layer structure in which insulating layers and resilient conductive layers are alternately formed, and
wherein the capacitor includes a first insulating film formed over the entire side surfaces of the capacitor trench, a first conductive layer having a lower surface formed over an upper surface of the first insulating film and over the bottom of the capacitor trench so that the first conductive layer is electrically coupled to the substrate at the bottom of the capacitor trench, a second insulating film formed having a lower surface formed over an upper surface of the first conductive layer, and a second conductive layer which is connected to the MOSFET at the major surface of the substrate and having a lower surface formed over an upper surface of the second insulating film.

3. A semiconductor device as set forth in claim 1, wherein a semiconductor region having said first conductivity type is formed in contact with the bottom of the trench.

4. A semiconductor device as set forth in claim 1, wherein a semiconductor region having a second conductivity type opposite to said first conductivity type is formed in contact with the bottom of the trench.

5. A semiconductor device as set forth in claim 1, wherein a first semiconductor region is formed in contact with the bottom of the trench and is connected to an adjacent semiconductor region similarly formed at the bottom of the trench.

6. A semiconductor device as set forth in claim 1, wherein said conductive layers are comprised of a resilient conductive material.

7. A semiconductor device as set forth in claim 2, including means for holding said substrate at a fixed potential so that said first conductive layer is electrically coupled to a fixed potential at the bottom of said capacitor trench.

* * * * *